(12) United States Patent
Makino et al.

(10) Patent No.: US 8,366,833 B2
(45) Date of Patent: Feb. 5, 2013

(54) PLASMA PROCESSING APPARATUS AND PLASMA PROCESSING METHOD

(75) Inventors: Hiroyuki Makino, Kanagawa (JP); Masaru Tanaka, Kanagawa (JP)

(73) Assignee: Sumitomo Heavy Industries, Tokyo (JP)

( * ) Notice: Subject to any disclaimer, the term of this patent is extended or adjusted under 35 U.S.C. 154(b) by 0 days.

(21) Appl. No.: 12/985,004

(22) Filed: Jan. 5, 2011

(65) Prior Publication Data

US 2011/0097510 A1    Apr. 28, 2011

Related U.S. Application Data

(63) Continuation of application No. PCT/JP2009/062776, filed on Jul. 15, 2009.

(30) Foreign Application Priority Data

Jul. 16, 2008  (JP) .................................. 2008-185016

(51) Int. Cl.
  *C23F 1/00*  (2006.01)
  *H01L 21/306* (2006.01)
  *C23C 16/00* (2006.01)

(52) U.S. Cl. ................. 118/728; 118/723 R; 118/723 E; 156/345.24; 156/345.28

(58) Field of Classification Search ........................ None
See application file for complete search history.

(56) References Cited

U.S. PATENT DOCUMENTS

| | | | | |
|---|---|---|---|---|
| 5,273,610 | A | * | 12/1993 | Thomas et al. .......... 156/345.28 |
| 5,699,223 | A | | 12/1997 | Mashiro et al. |
| 6,129,806 | A | * | 10/2000 | Kaji et al. ................ 156/345.46 |
| 6,197,151 | B1 | | 3/2001 | Kaji et al. |
| 6,273,023 | B1 | * | 8/2001 | Tsuchihashi et al. ..... 118/723 E |
| 6,902,683 | B1 | | 6/2005 | Kaji et al. |
| 7,100,532 | B2 | * | 9/2006 | Pribyl ......................... 118/723 I |
| 7,169,255 | B2 | * | 1/2007 | Yasui et al. .............. 156/345.28 |
| 2002/0069971 | A1 | | 6/2002 | Kaji et al. |
| 2004/0178180 | A1 | | 9/2004 | Kaji et al. |
| 2005/0082006 | A1 | | 4/2005 | Kaji et al. |
| 2006/0144518 | A1 | | 7/2006 | Kaji et al. |

FOREIGN PATENT DOCUMENTS

| | | |
|---|---|---|
| JP | 7-130826 | 5/1995 |
| JP | 8-17808 | 1/1996 |
| JP | 11-330217 | * 11/1999 |
| JP | 2001-358129 | 12/2001 |
| JP | 2000-49216 | 2/2002 |
| JP | 2003-77904 | 3/2003 |
| JP | 2007-73568 | 3/2007 |
| WO | 02/059954 | 8/2002 |
| WO | 2006/107044 | 10/2006 |

* cited by examiner

*Primary Examiner* — Dah-Wei Yuan
*Assistant Examiner* — Binu Thomas
(74) *Attorney, Agent, or Firm* — Squire Sanders (US) LLP

(57) ABSTRACT

Provided is a plasma processing apparatus including: an electrostatic chuck configured to hold a substrate inside a vacuum container, a pulse power source configured to apply a pulse having positive and negative polarities as a bias voltage and a controller configured to control the positive and negative polarities of the pulse.

3 Claims, 2 Drawing Sheets

PLASMA PROCESSING APPARATUS AND PLASMA PROCESSING METHOD

RELATED APPLICATION

Priority is claimed to Japanese Patent Application No. 2008-185016, filed Jul. 16, 2008, and International Patent Application No. PCT/JP2009/062776, the entire content of each of which is incorporated herein by reference."

BACKGROUND

1. Technical Field

The present invention relates to a plasma processing apparatus that processes a substrate by using plasma, and a plasma processing method thereof.

2. Description of the Related Art

As examples of a plasma processing apparatus, two types of plasma processing apparatuses that perform ion implantation using plasma are known.

Type 1: The application of a bias voltage is performed by using a high-frequency AC in order to reduce the influence of a resist pattern or the like on a substrate (refer to the pamphlet of WO2006/107044).

Type 2: The application of a positive bias voltage is performed by using a pulse power source (refer to Japanese Unexamined Patent Publication No. 2001-358129).

The type 1 is often used when the bias voltage is low. However, since AC voltage is applied, extra energy is implanted to the wafer, and the thermal load on the wafer increases.

The type 2 can adjust a positive potential not involved with ion implantation, and decrease the thermal load on the wafer.

However, although the ion implantation apparatus includes an electrostatic chuck (which may be hereinafter simply referred to as an ESC) that holds a substrate inside a vacuum container and performs temperature management of the substrate, the bias application method differs according to the type of the ESC. That is, examples of the ESC include a CR type (Coulomb type) that capacitively prevents current from flowing and a JR type (Johnsen-Rahbek type) that makes minute current flow.

When the CR type ESC is used, the current for ion implantation flows as a capacitance component without being influenced by substrate resistance due to upper and lower capacitors. On the other hand, when the JR type ESC is used, the current for ion implantation is influenced by a substrate resistance. However, when the substrate has a resist mask (a resist pattern) or the like that prevents the current from flowing, the current flows in the peripheral direction of the substrate through the position contacting the ESC, whereby the uniformity of the ion implantation is influenced. In general, the method of using the CR type ESC is rarely influenced by the resist mask or the like, and uniformity of the ion implantation can be stably obtained.

As for the bias application of the ion implantation apparatus that uses a pulse power source and is used to perform ion implantation, there are three types of parameter, that is, frequency, duty ratio, and voltage. However, such parameters are not particularly optimized in the current state, and in fact, desirable parameter values are determined through a test. For this reason, this method is not efficient.

When ion implantation is performed by using a pulse power source, the JR type ESC is used in many cases. This is because DC current does not easily flow in the CR type ESC. In this case, the frequency of the pulse power source is set to 10 kHz or less. As the upper limit of the frequency, the frequency (about 1 MHz or less) at which ions can be traced is set as the upper limit. However, even in the JR type ESC, the current of the capacitance component of the capacitor is mainly used at a high frequency (10 kHz or more).

SUMMARY

According to an embodiment of the invention, there is provided a plasma processing apparatus including: an electrostatic chuck configured to hold a substrate inside a vacuum container, a pulse power source configured to apply a pulse having positive and negative polarities as a bias voltage and a controller configured to control the positive and negative polarities of the pulse.

According to another embodiment of the invention, there is provided a plasma processing method including: holding a substrate by using an electrostatic chuck, applying a pulse having positive and negative polarities as a bias voltage and controlling each of the positive and negative polarities of the pulse.

DETAILED DESCRIPTION

Figure 1:
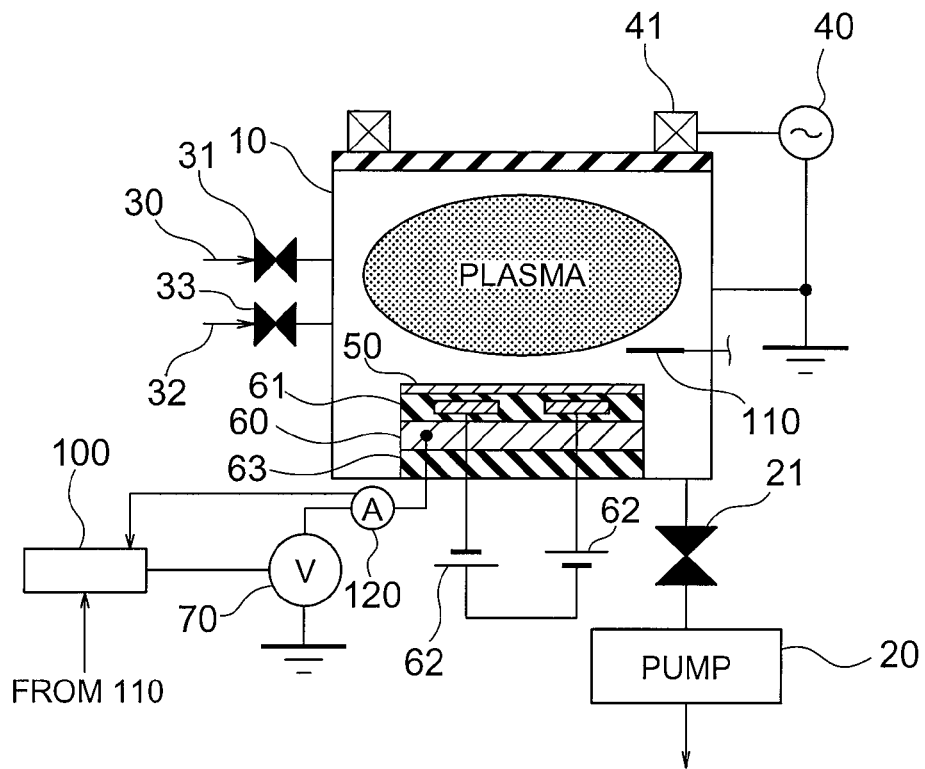
FIG. 1 is a diagram illustrating a schematic configuration of an ion implantation apparatus which is an example of a plasma processing apparatus according to the invention and performs a plasma process using plasma.

As described above, when a current flows to the substrate resistance component by using the JR type ESC that makes minute current flow by using a DC power source as a bias voltage source, if an insulator such as a resist mask exists on the substrate, current does not flow to that portion. For this reason, since the ion implantation is influenced by the pattern (for example, a resist pattern) of the insulator, it is difficult to perform the ion implantation uniformly.

On the other hand, when a CR type ESC is used which uses an AC power source as a bias voltage source, since the entire substrate exists on an insulator, a resistance current does not flow, but a capacitive current flows. For this reason, the influence of the pattern of the insulator is small. However, when the AC power source is used, since the voltage having the same degree of positive and negative polarities is applied, extra thermal load is generated on the substrate. When the voltage increases, the thermal load increases to the extent where it can no longer be ignored.

It is desirable to provide a plasma processing apparatus and a plasma processing method capable of reducing unnecessary thermal load applied to a substrate and performing a plasma process with high uniformity.

A plasma processing apparatus of the embodiment of the invention is designed to apply a pulse having positive and negative polarities as a pulse power source and to optimize at least one of the application voltage, pulse width, and frequency of the pulse in order to reduce unnecessary thermal load on a substrate and to perform a plasma process with high uniformity.

The plasma processing apparatus according to the embodiment further includes: a resistance sensor which measures a plasma resistance value inside the vacuum container, wherein the controller may set the application time of the positive bias pulse to be not more than the product of the predetermined capacitance of the electrostatic chuck and the plasma resistance value measured by the resistance sensor.

The plasma processing apparatus according to the embodiment further includes: a current sensor which measures a current during the application of a pulse, wherein the controller may receive a current value measured by the current sensor, and apply a reverse bias pulse after the application of the positive bias pulse until a current time integral value is equal to a current time integral value measured during the application of the positive bias pulse so as to discharge any remaining charge on the substrate or the electrostatic chuck due to the application of the positive bias pulse.

The plasma processing method according to the embodiment further includes: measuring a second plasma resistance value; and setting the application time of the positive bias pulse to be not more than the product of the predetermined capacitance of the electrostatic chuck and the measured plasma resistance value.

The plasma processing method according to the embodiment further includes: measuring a current during the application of the pulse; and applying a reverse bias pulse after the application of the positive bias pulse until a current time integral value is equal to a current time integral value measured during the application of the positive bias pulse so as to discharge any remaining charge on the substrate or the electrostatic chuck due to the application of the positive bias pulse.

In the plasma processing method according to the embodiment, wherein the voltage for each pulse of the positive bias pulse may be changed in multiple stages, the application of the reverse bias pulse may be discontinuously performed after the application of the positive bias pulse.

According to the embodiment of the invention, since it is possible to apply a pulse having positive and reverse polarities from a pulse power source and to optimize each of the positive and negative bias pulses, it is possible to perform a process such as ion implantation with high uniformity by reducing unnecessary thermal load applied to the substrate.

An ion implantation apparatus, which is an example of a plasma processing apparatus according to the invention and performs a plasma process using plasma, will be described with reference to FIG. 1.

A vacuum pump 20 is connected to a vacuum container 10 via a vacuum valve 21 so as to evacuate the vacuum container. A carrier gas source 30 and a process gas source 32 are respectively connected to the vacuum container 10 via gas valves 31 and 33 so as to introduce a carrier gas and a process gas thereinto. The vacuum container 10 is electrically earthed. A plasma generating coil 41 is installed on the outside of the vacuum container 10 so as to generate plasma, and the vacuum container 10 includes therein a substrate 50 to be processed and a substrate holder 60 holding the substrate 50.

A bias power source 70 is connected to the substrate holder 60 so as to generate a bias potential. A plasma generating power source 40 is connected to the plasma generating coil 41. An electrostatic chuck (ESC) 61 is installed on the substrate holder 60. In many cases, the electrostatic chuck 61 has a temperature management function as well as a chuck function. The electrostatic chuck 61 is connected to an electrostatic chuck power source 62. In addition, the substrate holder 60 is provided inside the vacuum container 10 via an insulation plate 63, and is electrically insulated from the vacuum container 10.

Examples of the plasma process include etching, doping, or the like which is used for performing ion implantation on the substrate 50. During ion implantation, ions are accelerated by a voltage applied to the substrate holder 60, and simply a bias voltage is applied to the substrate holder 60.

Figure 2:
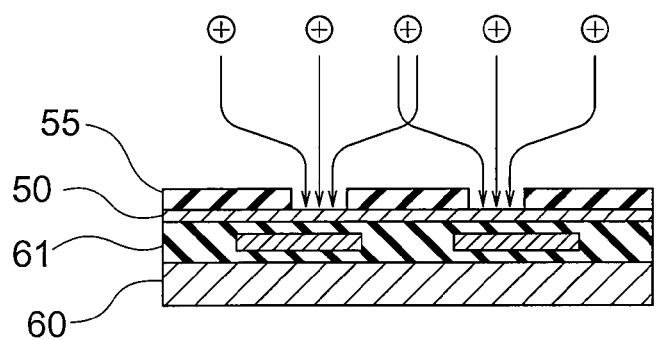
FIG. 2 is a diagram illustrating a problem arising when an insulator such as a resist mask exists on a substrate to be processed in the ion implantation apparatus shown in FIG. 1.

Generally, examples of the bias voltage source include an AC type voltage source and a DC type voltage source. As described above, when a current flows to a substrate resistance component by using a JR type electrostatic chuck that is designed to make minute current flow by using a DC power source as the bias voltage source, if an insulator (for example, a resist mask 55 or a dielectric film) exists on the substrate 50 as shown in FIG. 2, the current does not flow to that portion. For this reason, since ion implantation is influenced by the pattern (for example, a resist pattern) of the insulator, it is difficult to perform the ion implantation uniformly.

On the other hand, when a CR type electrostatic chuck is used which uses an AC power source as a bias voltage source, since the entire substrate exists on an insulator, a resistance current does not flow, but a capacitive current flows. For this reason, the influence from the pattern of the insulator is small. However, when the AC power source is used, since voltage having the same degree of positive and negative polarities is applied, extra thermal load is generated on the substrate. When the voltage increases, the thermal load increases to an extent where it cannot be ignored any more.

Therefore, in the embodiment of the invention, a pulse having positive and negative polarities can be applied from the bias power source 70, and a pulse power source capable of freely adjusting the pulse of positive and negative polarities is used. Then, a controller (control unit) 100 controlling the pulse power source is provided.

Examples of the parameters of the pulse power source include application voltage, pulse width, and frequency of the pulse, and the application voltage is determined by the ion implantation energy necessary from the application voltage. In the an embodiment of the invention, particularly the pulse width of the parameters can be automatically set by the controller 100 connected to the bias power source 70, the configuration of which will be described later.

The frequency of the pulse power source is substantially set to 1 MHz or less since the speed needs to be set so that ions can be traced. When the high-frequency pulse voltage is applied as the bias voltage, a capacitive current flows to the insulator (the substrate 50 and the electrostatic chuck 61) due to the effect of the capacitor, and the bias voltage is highly uniformly applied to the substrate 50 until the charge is saturated. Here, when the electrostatic chuck 61 is regarded as a dielectric body, the capacitance C is expressed by the following equation.

$$C = (\epsilon_0 \times S)/d$$

In the equation above, $\epsilon_0$ denotes the permittivity of the dielectric body, S denotes the area of the electrostatic chuck 61, and d denotes the thickness of the electrostatic chuck 61. Then, the charge Q when applying the voltage V is expressed by $Q = C \times V$. Here, the time (time constant) $\tau$ for applying the current is determined by the plasma resistance value R resulting from the external circuit or plasma, and is expressed by $\tau = R \times C$.

Generally, the plasma has nonlinearity with a capacitor component and a coil component, but herein is treated as simple resistance. The plasma resistance value R may be the plasma density function R(Ne).

The application time of the bias voltage using the pulse is denoted by the pulse width $t_p$, and the bias voltage is uniformly applied during a time when the condition of $t_p \leq \tau (= R \times C)$ is satisfied. In other words, even when the bias voltage is applied for the time constant τ or more, since only the thermal load increases, the bias voltage cannot be used as the ion implantation voltage.

Accordingly, the optimal pulse width corresponding to the plasma density can be set. For example, a resistance measurement mechanism can be provided so as to measure the plasma resistance value every time, and when the resistance value measured by the resistance measurement mechanism is input to the controller 100, the optimal pulse width can be automatically calculated and set by the controller 100. As the resistance measurement mechanism, for example, a probe resistance sensor (measurement unit) 110 for estimating the plasma resistance value by measuring the plasma density may be used.

Specifically, in order to reduce the influence of the pattern of the insulator (the resist mask 55, the dielectric film, or the like), the substrate is mounted on the insulator. In this case, the insulator is a CR type electrostatic chuck. However, when the frequency of the power source is 10 kHz or more, since the electrostatic chuck serves as an insulator, a JR type may be used. In many cases, the capacitance C of the electrostatic chuck is from several tens of nF to several nF or so. This is because the residual capacitance is large when the positive bias is set to 0 while the capacitance C is too large, and the dechucking function of the electrostatic chuck is degraded. When the plasma source is designed to generate plasma having an electron density Ne of $10^{11}$ to $10^{13}/cm^3$ (for example, ICP (Inductively Coupled Plasma), SWP (Surface Wave Plasma), HWP (Helicon Wave Plasma), ECR (Electron Cyclotron Resonance), CCP (Capacitively Coupled Plasma), a parallel plate, and the like), if the plasma is regarded as a simple resistance as described above, the plasma resistance value is from 10 kΩ to 1 MΩ or so. The bias voltage using a pulse is applied to the plasma.

Here, as described above, the time constant $\tau = R \times C$. That is, when the pulse width exceeds the time constant τ, unnecessary bias voltage is applied (when the duty ratio is 50%, the frequency is 50 kHz to 50 Hz).

As described above, the application time of the positive bias pulse, that is, the pulse width $t_p$ is set so as to satisfy the condition of $t_p \leq \tau (= R \times C)$.

Next, the reverse bias will be described. When implanting is simply performed by using a single polarity using a pulse, a charge may remain in the substrate 50 and the electrostatic chuck 61. The remaining charge vanishes together with electrons inside the plasma via the inside of the substrate 50 after the pulse potential is set to 0, but the charge does not vanish for the time $(R_{ins} \times C)$ determined by the resistance $R_{ins}$ of the insulator material and the substrate material. Generally, the resistance $R_{ins}$ is extremely large. Then, when the bias voltage is applied again before the elapsing of the time $(R_{ins} \times C)$, the time (the amount of charge) for the application of the bias voltage decreases by the amount of any remaining charge in the substrate 50 and the electrostatic chuck 61. When this is repeated several times, the amount of charge remaining continuously increases, and then the bias voltage is not effectively used.

Figure 3:
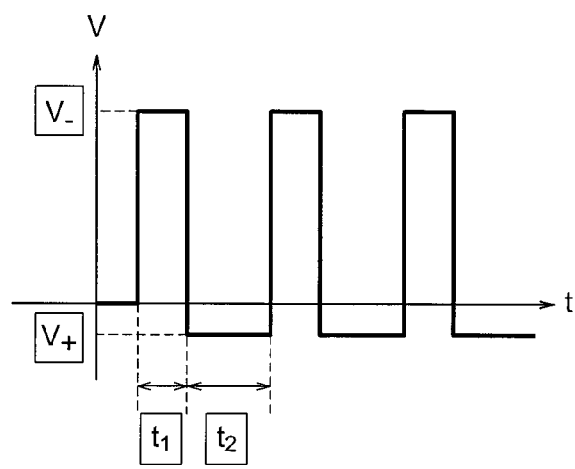
FIG. 3 is a waveform diagram illustrating a bias voltage generated by a pulse applied to a substrate holder shown in FIG. 1.

In order to reduce this state, a reverse bias voltage may be applied. The image of the pulse in this case is shown in FIG. 3. In FIG. 3, the bias voltage is denoted by the application voltage $V_-$, the reverse bias voltage is denoted by the discharge voltage $V_+$, and the amount of any remaining charge in the electrostatic chuck during the application of the bias voltage $V_-$ is denoted by $Q_-$. The reverse bias voltage $V_+$ is applied so as to set the amount $Q_-$ of charge to 0, and the amount of charge during the application of the reverse voltage $V_+$ is denoted by $Q_+$. At this time, the bias voltage $V_-$, the current $i_-$, the reverse bias voltage $V_+$, and the current $i_+$ are determined in accordance with the characteristics of the plasma, and the general image thereof is shown in FIG. 4.

When a current measurement mechanism (current sensor) 120 is provided in the line of the bias power source 70 so as to measure the current $i_+$ flowing during the application of the reverse bias, and the controller 100 applies a reverse bias so that the value (the time integral value of current) obtained by multiplying the measured current by the time is equal to or larger than the amount $Q_-$ of charge, it is possible to apply the bias voltage $V_-$ with high efficiency. Then, the application time t2 of the reverse bias voltage $V_+$ can be determined from the condition of the following equation (1).

$$\int_0^{t2} i_+ \cdot \Delta t = Q_- = C \cdot V_- \qquad \text{Equation (1)}$$

Figure 4:
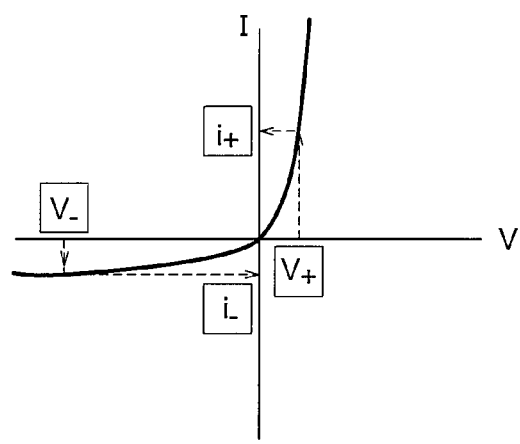
FIG. 4 is a characteristic diagram illustrating the relationship between a current and positive and reverse bias voltages applied to a substrate holder shown in FIG. 1.

In fact, since the current $i_+$ cannot be adjusted, the controller 100 estimates the reverse bias voltage $V_+$ corresponding to the current $i_+$ on the basis of the characteristics of FIG. 4, and applies the reverse bias voltage having the estimated value.

Further, since the current $i_-$ during the application of the positive bias pulse is measured by the current measurement mechanism 120 instead of the amount $Q_-$ of charge in the equation above, and the time integral value of the current $i_-$ measured by the controller 100 is used as the actual measurement value, control is easy. That is, the application time t2 of the voltage $V_+$ of the reverse bias pulse can be determined by the following equation (2).

$$\int_0^{t2} i_+ \cdot \Delta t = \int_0^{t1} i_- \cdot \Delta t \qquad \text{Equation (2)}$$

In Equation (2), t1 denotes the application time of the positive bias pulse, and is not more than the time constant $\tau (= R \times C)$ as described above. When the time constant t1 exceeds τ, the time constant t1 is set to τ.

As described above, the reverse bias voltage $V_+$ is determined so that the time integral value of the current $i_+$ is equal to the time integral value of the current $i_-$ measured during the application of the positive bias pulse, and the reverse bias pulse is applied for the time t2. However, when the amount $Q_+$ of charge exceeds $Q_-$, the bias voltage to be applied next time decreases by the exceeding amount.

Figure 5:
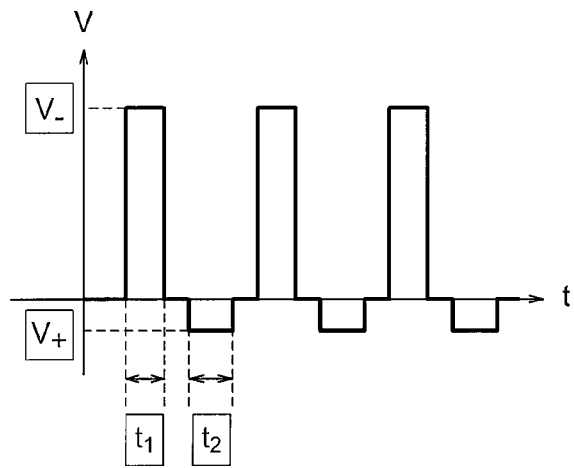
FIG. 5 is a waveform diagram illustrating another example of a bias voltage generated by a pulse shown in FIG. 3.

As shown in FIG. 5, the application time t1 of the positive bias pulse and the application time t2 of the next negative bias pulse may not be continuous in accordance with the type of the pulse power source, but is basically the same as above.

When the bias pulse of FIGS. 3 and 5 is applied, examples of the parameters which can be set by the controller 100 include the bias voltage (the application voltage) $V_-$, the reverse bias voltage (the discharge voltage) $V_+$, the application time (the pulse width of the application time) t1 of the positive bias pulse, and the application time (the discharged pulse width) t2 of the reverse bias pulse.

In addition, even when the pulse voltage is changed in multiple stages, the time integral value of the current $i_-$ actually flowing and the time (the application time of the voltage having positive and negative polarities) may be used.

According to the above-described embodiment of the invention, the following advantages are obtained.

It is possible to provide a plasma processing apparatus and a plasma processing method capable of performing ion implantation while being rarely influenced by a pattern of an insulator on a substrate by using a CR type electrostatic chuck. Of course, a JR type electrostatic chuck may be used on the condition that the frequency of a pulse power source is high.

It is possible to provide a plasma processing apparatus and a plasma processing method which rarely cause unnecessary thermal load.

It is possible to provide a plasma processing apparatus capable of automatically setting parameters such as frequency, duty ratio, and application voltage of a bias power source generating a pulse voltage having positive and negative polarities.

It is possible to provide a plasma processing apparatus capable of applying a reliable bias voltage.

It should be understood that the invention is not limited to the above-described embodiment, but may be modified into various forms on the basis of the concept of the invention. Additionally, the modifications are included in the scope of the invention. For example, in the above-described embodiment, the electrostatic chuck has the substrate temperature management function as well as a chuck function, but an electrostatic chuck without a substrate temperature management function may be used.

What is claimed is:

1. A plasma processing apparatus comprising:
an electrostatic chuck configured to hold a substrate inside a vacuum container;
a pulse power source configured to apply a pulse having positive and negative polarities as a bias voltage;
a controller configured to control the positive and negative polarities of the pulse; and
a resistance sensor configured to measure a plasma resistance value inside the vacuum container,
wherein the controller is configured to set an application time of the positive bias pulse to be no more than a product of a predetermined capacitance of the electrostatic chuck and the plasma resistance value measured by the resistance sensor.

2. A plasma processing apparatus comprising:
an electrostatic chuck configured to hold a substrate inside a vacuum container;
a pulse power source configured to apply a pulse having positive and negative polarities as a bias voltage;
a controller configured to control the positive and negative polarities of the pulse; and
a current sensor configured to measure a current during the application of a pulse,
wherein the controller is configured to receive a current value measured by the current sensor, and apply a reverse bias pulse after the application of the positive bias pulse until a current time integral value is equal to a current time integral value measured during the application of the positive bias pulse so as to discharge any remaining charge on the substrate or the electrostatic chuck due to the application of the positive bias pulse.

3. The plasma processing apparatus according to claim 1, wherein the frequency of the pulse power source is configured to exceed 10 kHz.

* * * * *